(12) United States Patent
Nakazato et al.

(10) Patent No.: US 6,465,834 B1
(45) Date of Patent: Oct. 15, 2002

(54) SEMICONDUCTOR DEVICE

(75) Inventors: Kazuo Nakazato, Cambridge (GB); Kiyoo Ito, Higashikurume (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/516,773

(22) Filed: Mar. 1, 2000

(30) Foreign Application Priority Data

Mar. 17, 1999 (JP) ............................................. 11-071404

(51) Int. Cl.⁷ .............................................. H01L 29/72
(52) U.S. Cl. ...................... 257/314; 257/278; 257/279; 257/280
(58) Field of Search ................................ 257/278, 279, 257/280, 314

(56) References Cited

U.S. PATENT DOCUMENTS 4,435,785 A * 3/1984 Chapman .................... 257/278

OTHER PUBLICATIONS

Shingaku Giho, vol. 81, No. 168, ED–81–90, 1991, pp. 75–82.
Japan Journal of Applied Physics, vol. 32, 1993, pp. 4916–4922.
IEEE Transactions of Electron Devices, vol. ED–13, No. 12, 1996, pp. 855–862.
IEEE Transactions on Electron Devices, vol. ED–40, No. 12, 1993, pp. 2326–2329.
IEDM 87, 1987, pp. 718–721.
IEEE Transactions of Electron Devices, vol. ED–32, 1985, pp. 106–123.

* cited by examiner

*Primary Examiner*—Edward Wojciechowicz
(74) *Attorney, Agent, or Firm*—Mattingly, Stanger & Malur, P.C.

(57) ABSTRACT

In the case of a large capacity DRAM (Dynamic Random Access Memory) of a conventional type, since a signal voltage read out from a memory cell is low, the action thereof is apt to be unstable. If a gain is added to a memory cell to obtain a large output voltage, the area for a memory cell becomes large. Accordingly, a memory cell with RAM action being stable and which requires a small area is needed. A memory cell according to the present invention is provided with MOS transistors 2, 3, 4, 5 to read out storage information, transistors 8 and 11*b* to write storage information, and a capacitor 11*a* to control the voltage at the storage node. These component parts are assembled to form a 3-dimensional structure.

28 Claims, 16 Drawing Sheets

44nm

SEMICONDUCTOR DEVICE

BACKGROUND OF THE INVENTION

1. Field of the Invention

The present invention relates to a large scale semiconductor memory device with high reliability.

2. Description of the Related Art

Semiconductor memories are broadly classified as RAMs (Random Access Memory) and ROMs (Read-only Memory). Among them, dynamic RAMs (DRAMs) are most commonly used as main storages for computers. A memory cell which stores memory is constituted with a storage capacitor and a transistor to read the charge stored in the capacitor. The memory can be realized with the minimum constituent elements as a RAM, so that it can suitably form a large scale storage unit. Consequently DRAMs are relatively inexpensive and have been manufactured in large quantities.

However, a problem with the DRAM is that it is apt to be unstable. The primary factor of instability is that the memory cell itself has no amplification activity, so that the read out signal voltage from the memory cell is small. Therefore, its action can easily be influenced by various kinds of noises. Further, a RAM can be divested of information charge accumulated in a capacitor by a p-n junction current (leak current) existing in a memory cell. Therefore, before the charge disappears, the memory cell is forced to perform refresh operations (refresh write) periodically in order to maintain stored information. The time period is called a refresh time and it is in the order of 100 msec. at present. However, this time period needs to be lengthened with the increase in storage capacity. In other words, there is a need to control the leak current; however this is getting more and more difficult with the miniaturization of the element.

The memory that solves this problem is a ROM, in particular a flash memory. The flash memory is, as generally known, as small as or smaller than the DRAM cell and it has a gain inside the memory cell, so that its signal voltage is essentially large; therefore, the action of the flash memory is stable. Since the flash memory stores storage charge in a storage node enveloped with an insulating film, the write time is extremely long.

When writing is repeated, the insulating film is forced to pass a current, and the insulating film gradually deteriorated and at least it becomes a conductive film, which makes it impossible to hold the charge. Therefore, the number or write times is generally limited to be within 100,000 times. In other words, the flash memory cannot be used as RAM. As explained in the above, both DRAMs and flash memories are appropriate for a large capacity memory, but each of them has advantages and disadvantages; therefore, the present invention attempts to utilize the advantages of both of them.

SUMMARY OF THE INVENTION

An object of the present invention is to provide a small-sized memory cell having gain inside and being able to operate as a RAM, a semiconductor memory device using the above cells and a manufacturing method for the memory device or its manufacturing apparatus. Further, another object of the present invention is to provide a nonvolatile RAM having the possibility to be able to guarantee a holding time of the order of 10 years owing to the memory cell constitution having no p-n junction current in an accumulation (storage) node.

In order to solve the above-mentioned problem, the constitution of the memory cell provided by the present invention comprises a MOS transistor holding an information voltage corresponding to information in its gate, a write transistor for providing the information voltage, and a capacitor for controlling the gate voltage.

When the memory cells are constituted as a memory cell array, a first terminal and a second terminal of the write transistor are respectively connected to the gate and a data line to provide write data, a third terminal thereof is connected to a word line, and further an electrode at an end of the capacitor is connected to the gate, the voltage of an electrode at another end is controlled at the time of reading the memory cells. The electrode at another end of the capacitor is connected to the word line.

Because of the characteristics of the write transistor, the maximum width of a depletion layer in a channel portion is desirable to be larger than the gate interval of the write transistor. Concerning the channel length L of the write transistor, a desirable condition among a gate internal D, a thickness of the gate insulation film $t_g$, a dielectric constant of silicon $\in_{si}$ and the dielectric constant of the gate insulation film $\in_g$ will be provided.

It is desirable to set the threshold value and the coupling capacity such that the write transistor is in an OFF state when not selected, and is in an ON state or in an OFF state according to a high state or a low state of the storage information at the time of reading.

As for a manufacturing apparatus to form the semiconductor device, it is desirable that the semiconductor films and the tunnel films are formed continuously and stably without touching the open air. More specifically, we can consider a constitution in which chambers for forming various kinds of films are connected to each other.

As a transistor provided by the present invention, there is provided a semiconductor device which is formed on a substrate, wherein the quantity of charge passing through the device can be controlled by controlling an electric field given thereto, comprising: a first node and a second node serving as a path of the charge; a channel region disposed between the first node and the second node and serving as the path of the charge; gate electrodes disposed for the purpose of providing the electric field to the channel region; a first tunnel barrier disposed between the first node and the channel region; and a second tunnel barrier disposed between the second node and the channel region; wherein the first node, the channel region, and the second node are formed with silicon as a main ingredient, and the impurity density of the first and the second nodes is higher than that of the channel portion, at least part of the tunnel barrier is formed with a nitride film or an oxide film, and the first node, the channel region, and the second node are stacked into a multi-layered structure in a direction having a right angle with that of the main surface of the substrate.

Owing to the fact that the path of the current is perpendicular to the surface of the substrate, a transistor can be constituted in a small area. As an example, the impurity density in the first node and the second node is $10^{20}$ cm$^{-3}$ or more and the impurity density in the channel space is $10^{17}$ cm$^{-3}$ or less. At least part of the tunnel barrier can be formed directly with a nitride film made by thermal nitrification.

Further, as a concrete device constitution, the first node, the channel region, and the second node are formed in a multi-layered structure and are built in a pillar structure in the direction perpendicular with that of the main surface of the substrate, the gate electrodes are formed along the side surface of the pillar structure and the first gate electrode region and the second electrode region have the pillar structure in between when viewed in a cross sectional view taken along a plane being perpendicular to the main surface of the substrate, and in the channel region the maximum value DL of the interval between the first gate electrode region and the second gate electrode region is smaller than the maximum width Xd of the depletion layer, on the condition that $X_d=5\sqrt{(2kT\in/(e'eN_c)}$ where k is Boltzman constant, T is an absolute temperature in the work environment of the semiconductor device, $\in$ is a dielectric constant of silicon, e is an absolute value of an electron charge, and $N_c$ is an impurity density in the channel region.

It is practical that the relation between the length L of the channel region and the maximum value DL of the gate interval lies in the range L>DL. It is also effective that the gate electrode is made of p-type silicon having a density higher than that of the channel space.

When the film itself forming the tunnel barrier is used as a diffusion barrier, the impurity density in the first node, that in the channel space and that in the second node can be varied discontinuously making the first and the second tunnel barriers borders.

In order to control the characteristics of the transistor, it is also possible to form a third tunnel barrier between the first and the second tunnel barriers.

As explained later with reference to FIG. 4, according to the present invention, there is provided a transistor comprising: a source region and a drain region; a channel region disposed between the source region and the drain region; gate electrodes disposed for the purpose of providing an electric field to the channel region; a first nitride film disposed between the source region and the channel region; and a second nitride film disposed between the drain region and the channel region; wherein the source region, the channel region, and the drain region are formed with semiconductors as a main ingredient and the density of impurities in the source region and the drain region is higher than that in the channel region, and the density of impurities in the source region, the channel region, and the drain region shows a discontinuous profile making the first nitride film and the second nitride film borders.

As the guidance in a case where one performs the device design of the transistor according to the present invention, there is provided a transistor comprising: a first electrode, a channel region, and a second electrode piled up in order to form a multi-layered structure upon a substrate; gate electrodes disposed adjacent to the channel region through an insulation film; a first intermediate film serving as a first tunnel barrier disposed between the first electrode and the channel region; and a second intermediate film serving as a second tunnel barrier disposed between the second electrode and the channel region; wherein the relation between the length L of the channel region and the maximum value W of the width of the channel region is kept under the condition of L>W.

More specifically the length L of the channel region is equal to the interval between the first intermediate film and the second intermediate film, and seen from a cross sectional view taken along a plane perpendicular to the piled up direction of the first electrode, the channel region and the second electrode, the gate electrodes are disposed in both sides of the channel region, and the maximum value W of the width of the channel region denotes the maximum value of the interval of gate electrodes disposed being separated from each other.

According to a manufacturing method provided by the present invention, there is provided a manufacturing method of a semiconductor device, comprising: a step of forming a plurality of polysilicon films and nitride films, in which each of them has different densities of impurities from each other and stacking them into a multi-layered structure in a state where the whole process is carried in an atmosphere being isolated from the open air, and a step in which the difference in the impurity densities between polysilicon films having different impurity densities can be reduced by thermal diffusion.

The details of the present invention will be made more clear by the following explanation.

DESCRIPTION OF THE PREFERRED EMBODIMENTS

Figure 1:
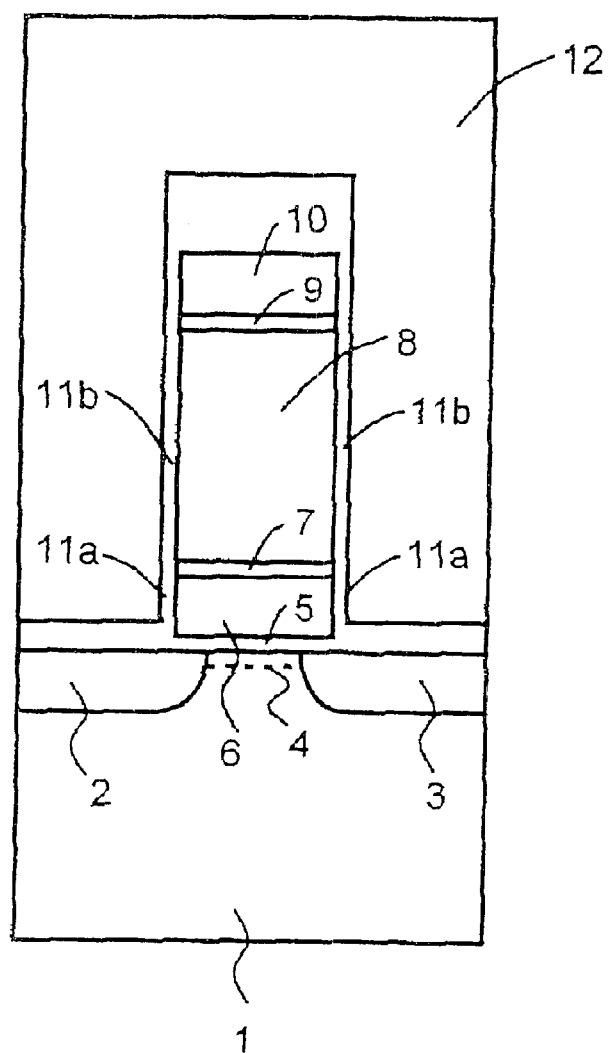
FIG. 1 shows a cross sectional view showing the structure of a memory cell according to the present invention.
Figure 2:
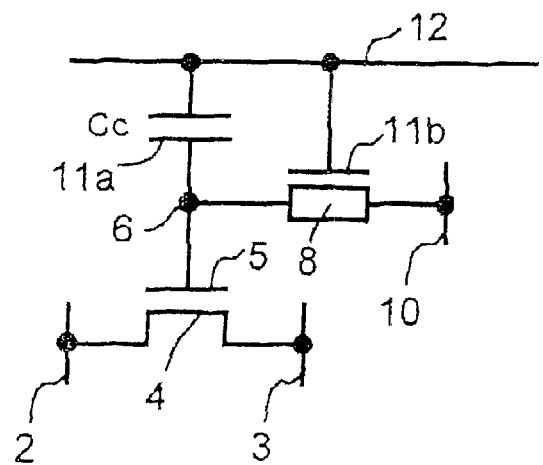
FIG. 2 shows a circuit diagram showing an equivalent circuit of the memory cell shown in FIG. 1.

FIG. 1 shows a cross sectional view of a memory cell shown in an embodiment according to the present invention. FIG. 2 shows an equivalent circuit of the memory cell shown in FIG. 1.

The memory cell shown in the embodiment according to the present invention comprises two transistors and a capacitor. The memory cell comprises, as shown in FIG. 2, read transistors 2, 3, 4 and 5, write transistors 8 and 11b, and a coupling capacitor Cc for controlling the voltage of a memory cell node. An end of an electrode of the coupling capacitor Cc and the gate 11b of the write transistor are connected to a word line 12 and another end of the write transistor is connected to a write data line 10.

An N channel MOSFET (hereinafter referred as sense MOS transistor) is assumed as a read transistor. As a write transistor, a transistor utilizing a tunnel phenomenon (hereinafter referred to as stacked transistor) is used.

Since this type of memory cell has a capacitor (Cc), it is possible to vary the voltage of the storage node in accordance with the word line voltage. Therefore, a memory cell can be selected without using another selection transistor, which makes it possible to realize a small-sized memory cell. From the point of view of the device structure, in particular as shown in FIG. 1, the sense MOS transistor, the stacked transistor and the coupling capacitor are unified 3-dimensionally into one transistor, so that the advantage of miniaturization is further exhibited. In comparison with a DRAM cell composed of a MOSFET and a known capacitor, a memory cell which requires approximately half an area and the surface has less unevenness can be manufactured with less number of masks. Thereby, a memory chip will be manufactured more easily and the manufacturing cost will be lowered.

Further, since the storage node in the memory cell has a structure enveloped with an insulation film, in principle there are not problems of a leak current caused by a p-n junction current and of a soft error as in the case of a DRAM cell. Therefore, when the threshold voltage of the stacked transistor is made high enough, a current which flows from the storage node to the data line through the stacked transistor while the memory cell is not selected (so called subthreshold current) can be controlled to be small enough, which makes it possible to make the data holding time long. Thereby, it will become possible to realize the operation of DRAM having an extremely long refresh time or the operation of nonvolatile which substantially does not need refresh operation.

The embodiment of the memory according to the present invention will be explained in detail by referring to FIG. 1. The memory is able to realize a gain cell structure in an area which is required by a single transistor. Reference numeral 1 denotes a semiconductor substrate (silicon p-type), 2 and 3 denote n-type layers of a high impurity density, 4 denotes a MOS channel 5, 11a and 11b denote insulation films, 7 and 9 denote tunnel films, 6 and 10 denote n-type layers of a high impurity density, 8 denotes a semiconductor layer of a low impurity density, and 12 denotes a p-type layer of a high impurity density.

FIG. 2 shows an equivalent circuit of the present memory cell structure. The equivalent circuit has a unified structure of stacked transistors (6, 7, 8, 9, 10, 11b, 12), sense MOS transistors (2, 3, 4, 5, 6), and a coupling capacitor (11a). Since storage information is read out by the sense MOS transistors (2, 3, 4, 5, 6), the quantity of charge necessary for storage can be small without being affected by the capacity of the read data lines (2 and 3). The stacked transistors (6, 7, 8, 9, 10, 11b, 12) are used as write transistors. The coupling capacitor (11a) is used as a selective read transistor for the cell storage information in a memory cell array structure.

In the present embodiment, the stacked transistors basically have a longitudinal type MOSFET (Metal-Oxide-Semiconductor-Field-Effect Transistor) of SOI(Silicon-on-Insulator), and further in the channel portion, a tunnel film is embedded. The impurity density in the channel portion of the stacked transistor is low, and the energy band is raised or lowered to control ON/OFF. In order to modulate the band effectively, it is important not to generate carriers in the channel portion of the stacked transistor, and a semiconductor layer of a low impurity density is suitable for this purpose. Excluding the tunnel film, the stacked transistor shown in the present embodiment is equivalent to the SIT (Static Induction Transistor) of a longitudinal type, [Nishizawa, Omi, SIT in VLSI, Shingaku Giho, Vol. 81, No. 168 ED-81-90 (1981), pp. 75–82], or to DG-SOI-MOSFET (Double-Gate Silicon-on-Insulator Metal Oxide-Silicon-Field-Effect-Transistor), [K. Suzuki, S. Satoh, T. Tanaka and S. Ando, Analytical Models for Symmetric Thin-Film Double-gate Silicon-on-Insulator Metal-Oxide-Semiconductor-Field-Effect-Transistors, Jpn. Appl. Phys. Vol. 32 (November 1993) pp. 4916–4922].

There is a possibility of a variety of modifications in the arrangements of the tunnel film to be embedded in the channel portion of the stacked transistor. In this embodiment as an example, showed a structure in which thin tunnel films are embedded along borders between the source and drain portions and the channel portion. The roles of the tunnel films are:

(1) To adjust the impedance of a transistor on the source side, (2) To keep the channel portion to be in a low impurity density by preventing the diffusion of impurities from the source and drain regions of a high impurity density, (3) To decrease the leak current on the side of the drain portion of GIDL (Gate Induced Drain Leakage Current).

Figure 3:
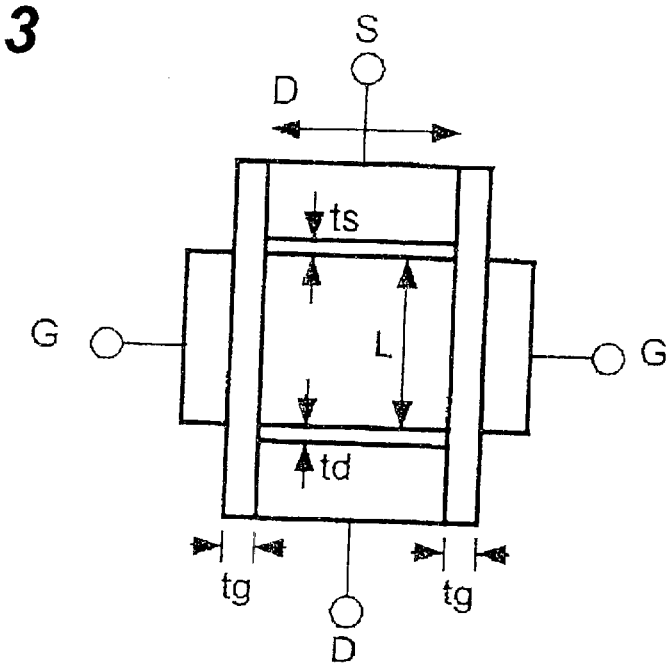
FIG. 3 shows a typical drawing showing a sectional view and structural parameters of a stacked transistor.

FIG. 3 shows the structural parameters of a stacked transistor. In the figure, D denotes a gate interval, L denotes a channel length, $t_g$ denotes a thickness of the gate insulation film, and ts and td denote thicknesses of the tunnel films on the source and drain sides.

Figure 4:
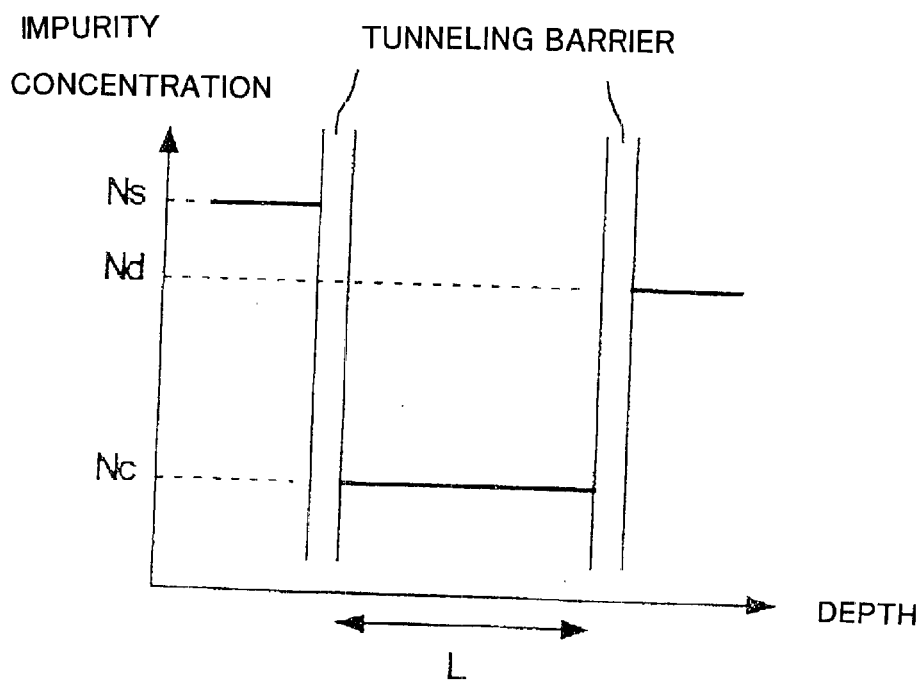
FIG. 4 shows a graph showing an impurity distribution in a stacked transistor.

FIG. 4 shows the distribution of impurities ranging from the source to the drain. It is necessary to keep the impurity density high (higher than $10^2$ cm$^{-3}$) in the source and drain regions (The density is expressed by Ns and Nd) and to keep the impurity density low (lower than $10^{17}$ cm$^{-3}$ in the channel portion (The density is expressed by Nc) in order to lower the parasitic resistance. In order to control the diffusion of impurities from the source space and the drain, it is effective to use a direct nitride film as tunnel films. For example, when silicon is annealed in the ambient atmosphere of ammonia at 900° C. for 3 min., a stable tunnel film of approximately 2 nm thick can be obtained.

In the following, a method for designing a stacked transistor will be explained.

A necessary condition to the impurity density in the channel portion is that the channel portion, becomes a complete depletion layer at the time when the transistor is in an OFF state. When the gate voltage is lowered gradually, the depletion layer is gradually formed in the channel portion beginning from the gate side; however when the voltage is lowered to a certain point holes are induced on the gate interface, and the depletion layer stops growing. The maximum width Xd of the depletion layer is given by approximately 5 times the device length [F. P. Heiman, Thin-Film Silicon-on-Sapphire Deep Depletion MOS Transistors, IEEE Trans. Electron Dev., Vol. ED-13, No. 12 (December 1966) pp. 855–862] and Xd depends on the impurity density $N_c$ of the channel portion.

$$X_d = \alpha \sqrt{2kT \epsilon_{si}/e^2 N_c} \tag{1}$$

Where k is Boltzman constant, T is an absolute temperature, $\epsilon_{si}$ is a dielectric constant of silicon, and e is absolute value of an electron charge.

Figure 5:
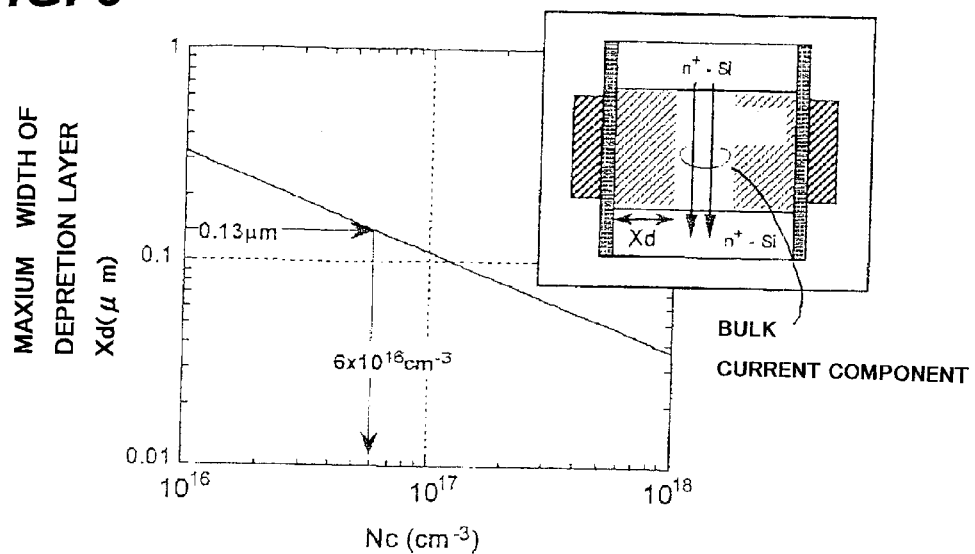
FIG. 5 shows a graph showing the dependability on the impurity density of the maximum width of a depletion layer.

The equation (1) was plotted as shown in FIG. 5. The axis of ordinates expresses the maximum width Xd of the depletion layer, and the axis of abscissas expresses the impurity density Nc in the channel portion. At the time when the transistor is in an OFF state, in order to make the channel portion a complete depletion layer and to decrease the bulk current component, the gate interval D shall be smaller than the maximum width Xd of the depletion layer, that is, $$D < Xd \tag{2}$$

The expression, D<2Xd, is to be exact for the condition for obtaining a complete depletion layer, but when the transistor is in an OFF state it is necessary to avoid the generation of carriers, so that the equation (2) is deemed to be the design standard allowing the operation margin. When D=0.13 mm, the condition becomes Nc<6×10$^{16}$ cm$^{-3}$.

Figure 6:
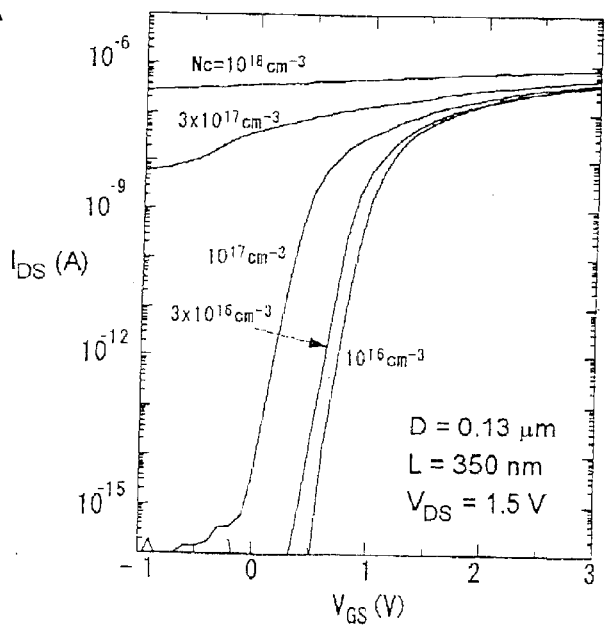
FIG. 6 shows a graph showing the DC characteristics of a stacked transistor when the impurity density in the channel portion is varied.

FIG. 6 shows the characteristics of a transistor when the impurity density in the channel portion is varied. When the impurity density in the channel portion is high, at the time when the transistor is in an OFF state a bulk current component remains, and the control of the drain current by the gate voltage becomes difficult. FIG. 6 shows the case where the gate interval D=0.13 μm, channel length L=350 nm, VDS=1.5 volt, and when Nc=3×10$^{17}$ cm$^{-3}$, the control of the drain current becomes difficult, but when Nc=10$^{17}$ cm$^{-3}$, the drain current can be controlled tolerably well, and when Nc=3×10$^{16}$ cm$^{-3}$, the ON and OFF of the drain current becomes possible.

The energy band of the channel portion is decided by the competition between the potential of the source and the drain, and the potential of the gate. In a case where the channel length is short, a current which flows through the transistor is largely modulated by a voltage between the source and the drain but the controllability by the gate voltage is lost (punch through). In a case where the channel length is long, the dependability of the current which flows through the transistor on the voltage between the source and the drain becomes weak, but the controllability by the gate voltage becomes strong. Generally, in the case of the latter, the design of the circuit is easy. The controllability by the gate voltage is generally expressed with a subthreshold coefficient S, which is the variation quantity of the gate voltage necessary to vary the drain current by one place, and in a case where there is no electron correlation, ln10·kT/e~60 mV is the theoretical minimum value. In a case where the transistor has a structure as shown in FIG. 3, the value of it is given by the equation shown below, $$S = \ln 10 kT/e \times 1/(1 - 2e^{-L/2\lambda}) \tag{3}$$

[K. Suzuki, T. Tanaka, Y. Tosaka, H. Horie, and Y. Arimoto, Scaling theory for double-gate SOIMOSFETs, IEEE Trans. Electron Dev. Vol. ED-40 (1993) pp. 2326–2329]

Now, l is given by the following equation, $$\lambda = \sqrt{D^2/8 + \epsilon_{si}/2\epsilon_g \times D I_g} \tag{4}$$

Where $\epsilon_g$ expresses a dielectric constant of the gate insulation film.

Figure 7:
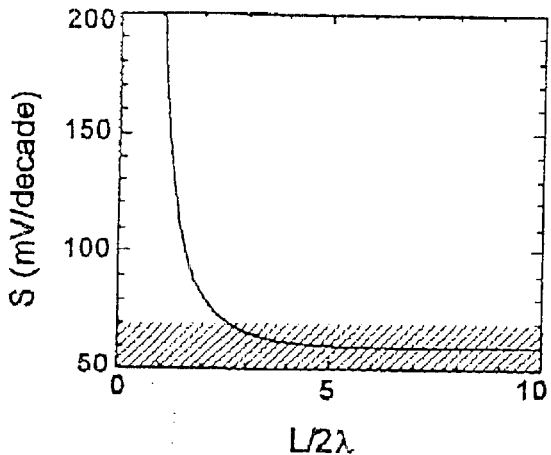
FIG. 7 shows a graph showing the dependability of a subthreshold coefficient on the channel length.

The equation (3) was plotted as shown in FIG. 7. In order to obtain (S<70 mV)/decade, the condition shown by the expression (5) is necessary, $$L > 5l \tag{5}$$

and when D=0.13 mm and the gate insulation film is a silicon oxide film of 10 nm, the channel length requires 320 nm or more.

Figure 8:
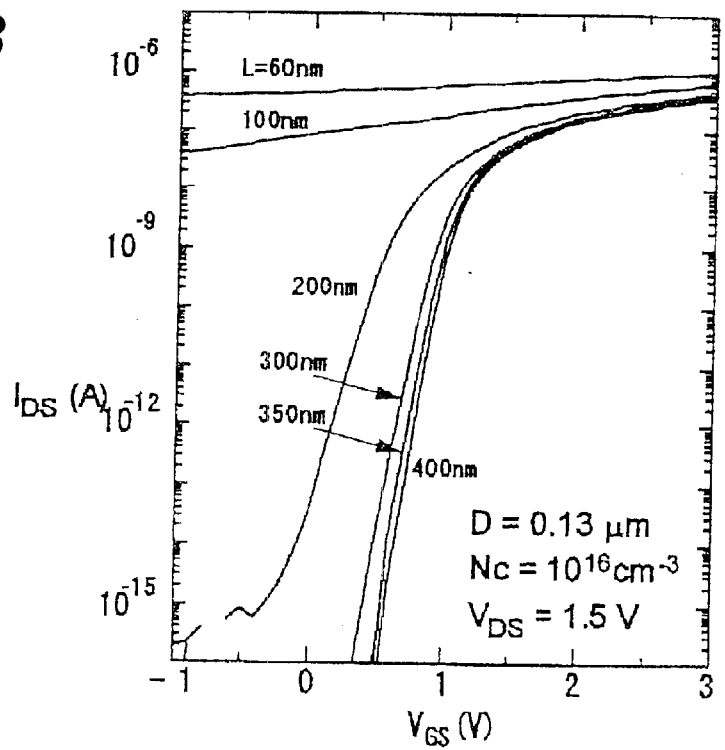
FIG. 8 shows a graph showing the DC characteristics of a stacked transistor when the channel length is varied.

FIG. 8 shows the transistor characteristics when the channel length is varied. When the channel length is short, at the time when the transistor is in an OFF state, a punch through current flows and it becomes impossible to modulate the drain current by the gate voltage. For example, according to FIG. 8, when the channel length is 300 nm or more, ideal characteristics are shown. When the length is in the order of 200 nm it is possible for use.

Figure 9:
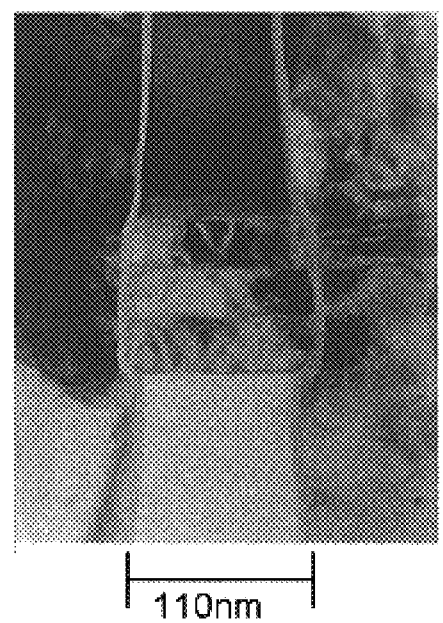
FIG. 9 shows a cross sectional view of a trial transistor obtained from a cross sectional TEM photograph.

FIG. 9 shows a sectional view by TEM photograph of an element having a channel length (L) of 60 nm and a gate interval (D) of 110 nm. In the present example, the gate insulation film is a silicon oxide film of 6 nm thick, and l which is given in equation (4) becomes 50 nm and L/2l becomes 0.6, and from FIG. 7 the subthreshold coefficient becomes infinity. In other words, it is the condition necessary to the case where the gate voltage becomes unable to control the drain current.

Figure 10:
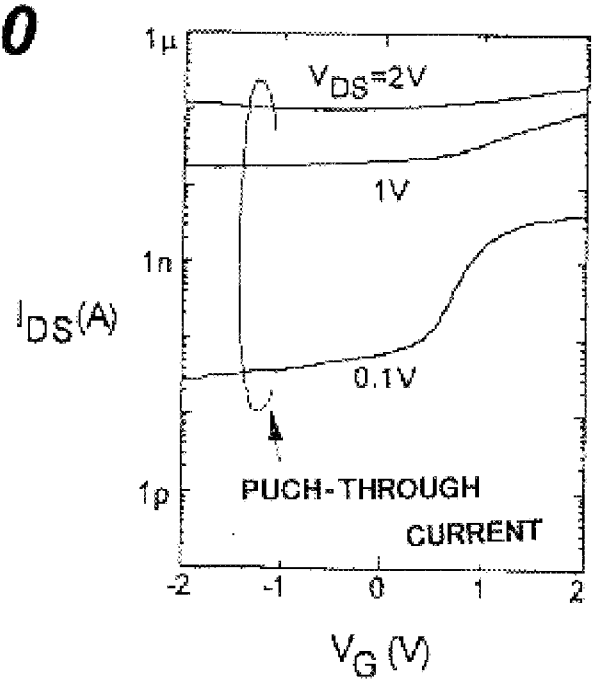
FIG. 10 shows a graph showing the DC characteristics of the transistor shown in FIG. 9.

FIG. 10 shows the result of the measurement of DC characteristics of this transistor, and we can observe a large punch through current in it.

Figure 11:
FIG. 11 shows a cross sectional view of a trial transistor obtained from a cross sectional TEM photograph.

FIG. 11 shows a cross sectional view by a TEM photograph of an element having a channel length (L) of 60 nm and a gate interval (D) of 44 nm. In the present example, the values of l and L/2l given by the equation (4) become respectively 25 nm and 1.2, and the subthreshold coefficient becomes 150 mV from FIG. 7.

Figure 12:
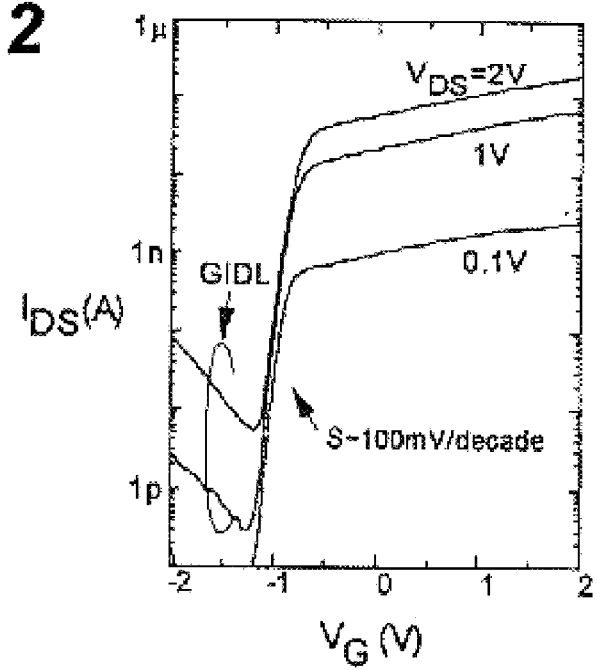
FIG. 12 shows a graph showing the DC characteristics of the transistor shown in FIG. 11.

FIG. 12 shows the result of the measurement of DC characteristics of this transistor, and the punch through current has disappeared, and we obtained 100 mV as a subthreshold coefficient.

In the above description, the case where the channel portion is formed with n-type silicon is described, but it is an effective way for obtaining a stable channel portion to form it thin with p-type silicon.

Figure 13:
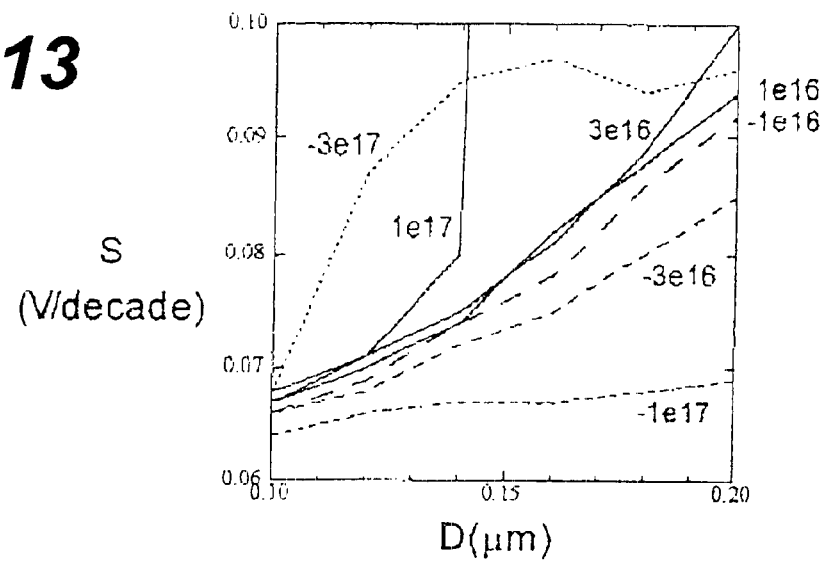
FIG. 13 shows the dependability of the subthreshold value on the gate interval.
Figure 14:
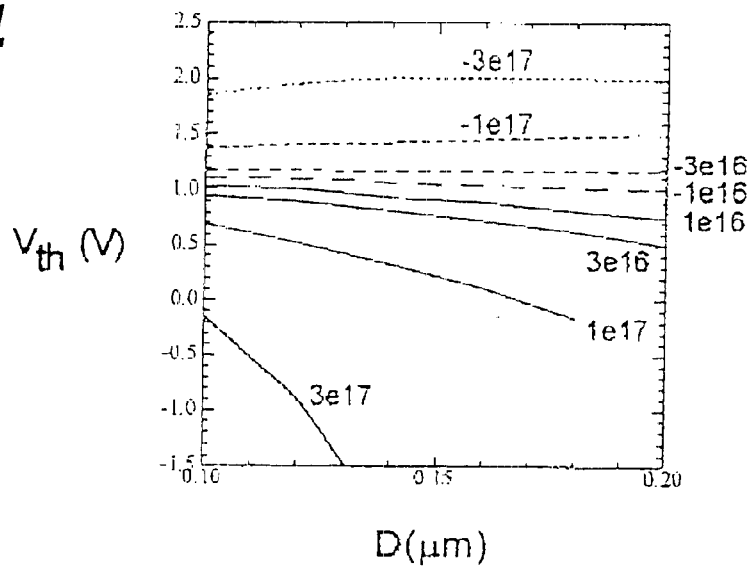
FIG. 14 shows the dependability of the threshold value on the gate interval.

FIGS. 13 and 14 show the result of plotting of the subthreshold coefficient (S) and a threshold value (Vth) as a function of the gate interval (D) making the impurity density in the channel portion a parameter. In the diagram, Nc>0 expresses the impurity density in the n-type channel portion and Nc<0 expresses that in the p-type channel portion. When the impurity density in the channel portion is p-type $10^{17}$ cm$^{-3}$, we obtain a subthreshold coefficient of 70 mV/decade or less and a high threshold value which is not influenced much by the gate interval. In order to make the threshold value high, a high impurity density p-type silicon is used as the material to form the gate. From the view point of the operation of the memory cell it is desirable to make the threshold value as high as possible. It will be explained in detail later.

The cause of the problem is GIDL (Gate Induced Drain Leakage Current). The reason why is that electrons raise band-tunneling between bands by a strong electric field on the interface of the gate insulation film in the drain region, which results in the formation of pairs of electrons and holes. The electrons can be absorbed by the drain electrode but the holes enter into the channel portion, which can be the cause of the deterioration in the element characteristics such as a leak current. The band-tunneling between bands is decided by two competitive factors [T. Y. Chan, J. Chen, P. K. Ko, and C. Hu, The Impact of Gate-Induced Drain Leakage Current on MOSF Et Scaling, IEDM87 (1987) pp. 718–721].

At first, it is necessary that a band is able to bend larger than the energy gap does, and the band is able to bend easily when the impurity density in the drain is low. On the other hand, the higher is the density of impurities in the drain the shorter can be the tunnel distance. In the result of the competition between these two factors, GIDL current takes the maximum value at an impurity density in the drain of approximately $2\times10^{18}$ cm$^{-3}$ and with the increase in the quantity of deviation from the value, it decreases exponentially. In a case of a MOS transistor of a conventional type, the impurity density varies continuously from a high impurity density of ($10^{20}$ cm$^{-3}$) in the drain region to a low impurity density ($10^{17}$ cm$^{-3}$) in the channel space, so that the impurity density ($2\times10^{18}$ cm$^{-3}$) where the GIDL current takes the maximum value exists in the above range without fail. In the case of the structure of the present stacked transistor, the diffusion of impurities is prevented by the tunnel films disposed in the upper and lower parts, so that it is possible to avoid the above-mentioned impurity density region. As shown in FIG. 4, impurities can be diffused in silicon by a thermal treatment (for example, 850° C., 20 min.), and a uniform distribution of impurities is obtained in the source region, the drain portion and the channel portion.

There is a probability that a GIDL current can be avoided intrinsically in the present structure; however, in the trial transistor using a gate oxide film of 6 nm thick, GIDL current was observed in a range where the gate voltage is low. We consider that it is effective to make the gate insulation film thicker to decrease the GIDL current further. Even though the gate insulation film is made thicker, as seen from the equations (3) and (4), the subthreshold coefficient does not grow much larger. For example, assuming that a gate interval is 0.13 mm and a channel length is 350 nm, even though a thickness of the gate oxide film is changed from 6 nm to 30 nm, the value of the subthreshold (S) changes only from 66 mV to 82 mV. However, since the ON current is proportional to the reciprocal of the thickness tg of the gate insulation film, ON current is made small when tg is made large [K. Suzuki, S. Satoh, T. Tanaka, and S. Ando, Analytical Models for Symmetric Thin-Film Double-Gate Silicon-on-Insulator Metal-Oxide-Semiconductor-Field-Effect-Transistor, Jpn. J. Appl. Phys. Vol. 32 (November 1993) pp. 4916–4922].

The effect of the tunnel films of upper and lower sides for the drain current is that it cuts down both ON current and OFF current by 2 to 3 places in comparison with a case where there are not tunnel films. In the case of the present memory cell, since the quantity of storage charge is small (approximately 1,000 electrons), a large driving ability is not needed for charge/discharge. The ON current of 0.1 mA is enough for high speed write for 10 nsec. The OFF current is important to keep a memory holding time long. The OFF current of $10^{-20}$ A is expected by calculation, and it corresponds to a storage holding time of an hour or more. In the calculation, an ideal condition is assumed, but actually:

(A) the whole channel portion is not constituted with complete crystals and it has a polycrystalline structure, and (B) there are electron traps on the interface or in the inside of the tunnel film. Because of the above-mentioned reasons, there may be a factor of causes of leak current produced by hopping conduction through a level, pinning of potential, segregation of dopant, and the like. The tunnel films function to control these phenomena.

Next, the method for designing the coupling capacitor (11a) and the sense MOS transistor (2, 3, 4, 5, 6) will be described. The three states of a memory cell, that is a storage holding state, a read time state and a write time state, are switched to each other by the voltage (VW) of the word line (12). For example, the storage holding state is obtained at –2 V of VW, the read out time is obtained at 0.5 V and the write time is obtained at 3 V. In the write time (VW=3 V), a stacked transistor becomes an ON state and the potential of the storage node (6) becomes identical to that of the data line (10) for writing. For example, when 1.5 V is applied to the write data line (10), a High state is written, and when 0 V is applied to it, a Low state is written. In a storage holding time, an enough low voltage (–2 V) is applied to the word line (12) and the stacked transistor is made to an OFF state. In a storage read time, the potential of the storage node (6) is raised by the capacitance Cc. The conditions to read out only selected cells, in a configuration of a memory cell array, are shown in the following. (1) In a storage holding state (VW=2 V) under the non-selection condition, the sense MOS transistor is made to an OFF state without using the storage information. (2) In the read time (VW=0.5 V) under the selection condition, when the storage information is High, the sense MOS transistor is made to an ON state and when the storage information is Low, the sense MOS transistor is made to an OFF state. Assuming that, in a storage holding state, when the storage information is High, the potential of the storage node (6) is VH(SB), and when the storage information is Low, the potential of the storage node (6) is VL(SB), in a read time, when the storage information is High, the potential of the storage node (6) is VH(R), and when the storage information is Low, the potential of the storage node is VL(R), the threshold value VTH(MOS) of a sense MOS transistor shall satisfy the following condition, $$VH(R) > VTH(MOS) > VL(R), VH(SB), VL(SB) \tag{6}$$

Figure 15:
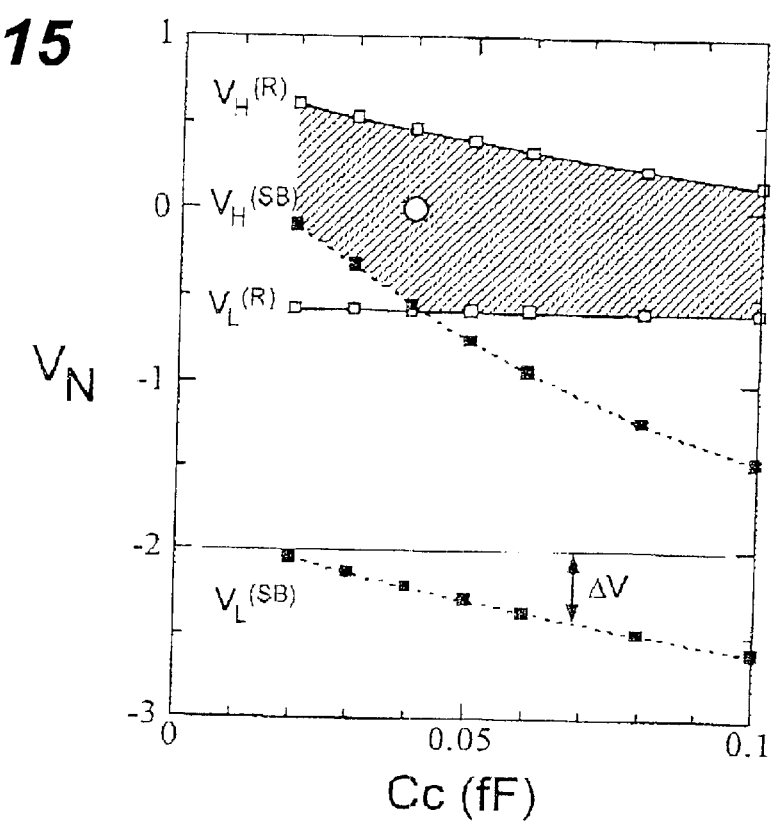
FIG. 15 shows a graph showing the dependability of the storage node potential on the coupling capacitance.

We plotted the storage node potential VN as a function of the coupling capacitor Cc as shown in FIG. 15. The stacked transistor is designed to be an optimum one by the method mentioned in the above using a 0.13 mm design rule. To be concrete, D=0.13 mm, L=350 nm, Nc=$10^{17}$ cm$^{-3}$ (p-type), tg=10 nm (silicon oxide film), ts=td=2 nm (silicon nitride film), and Ns=Nd=5×$10^{20}$ cm$^{-3}$ (n-type). The condition to satisfy the equation (6) is shown by the hatched area in FIG. 15. From the diagram, we know that when the coupling capacitor is 0.04 fF and the threshold value of the sense MOS transistor is 0V (the point marked with a white circle as shown in FIG. 15), the value of margin takes the maximum value. This value of the coupling capacity can be realized when a thickness of the storage node (6) is 50 nm.

Figure 16:
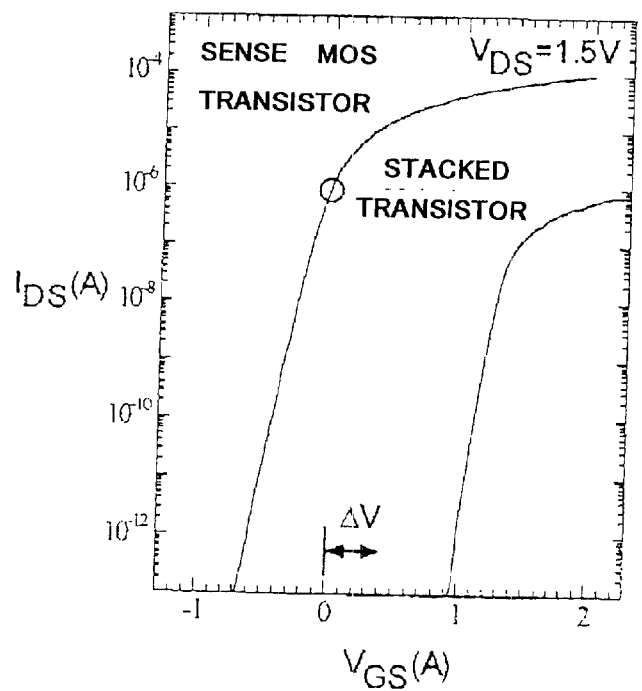
FIG. 16 shows a graph showing the DC characteristics of an optimized transistor.

FIG. 16 shows the DC characteristics of an optimized sense MOS transistor and an optimized stacked transistor. The threshold value of the sense MOS transistor is given by the white circle shown in FIG. 16. In a storage holding state, in order that the storage information is held, the DV shown in FIG. 15 must be within 0.5 V (from the characteristics of a stacked transistor shown in FIG. 16), and the value of the Cc 0.04 fF satisfies the condition. The condition is one of the design factors to decide the voltage (−2 V in the example) of the word line in the storage holding time.

Figure 17:
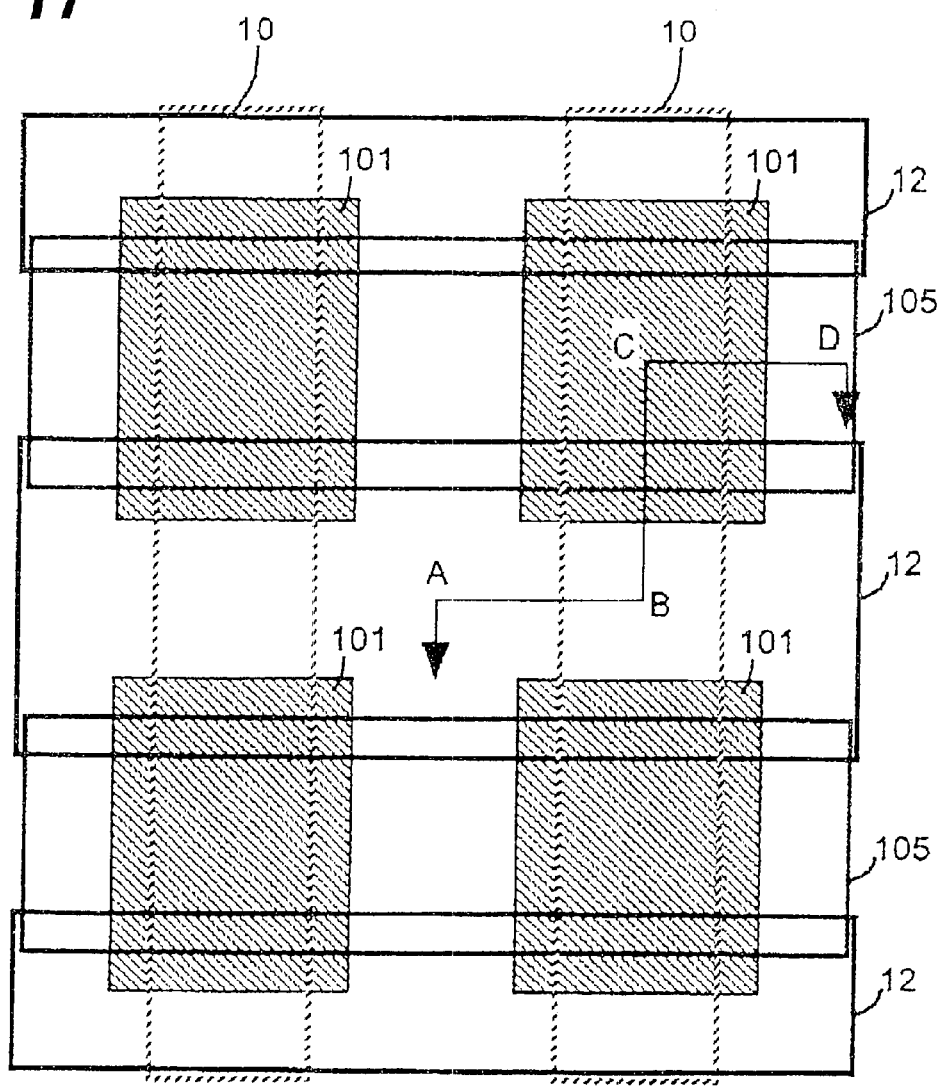
FIG. 17 shows a plan view showing the memory cell array according to the present invention.
Figure 18:
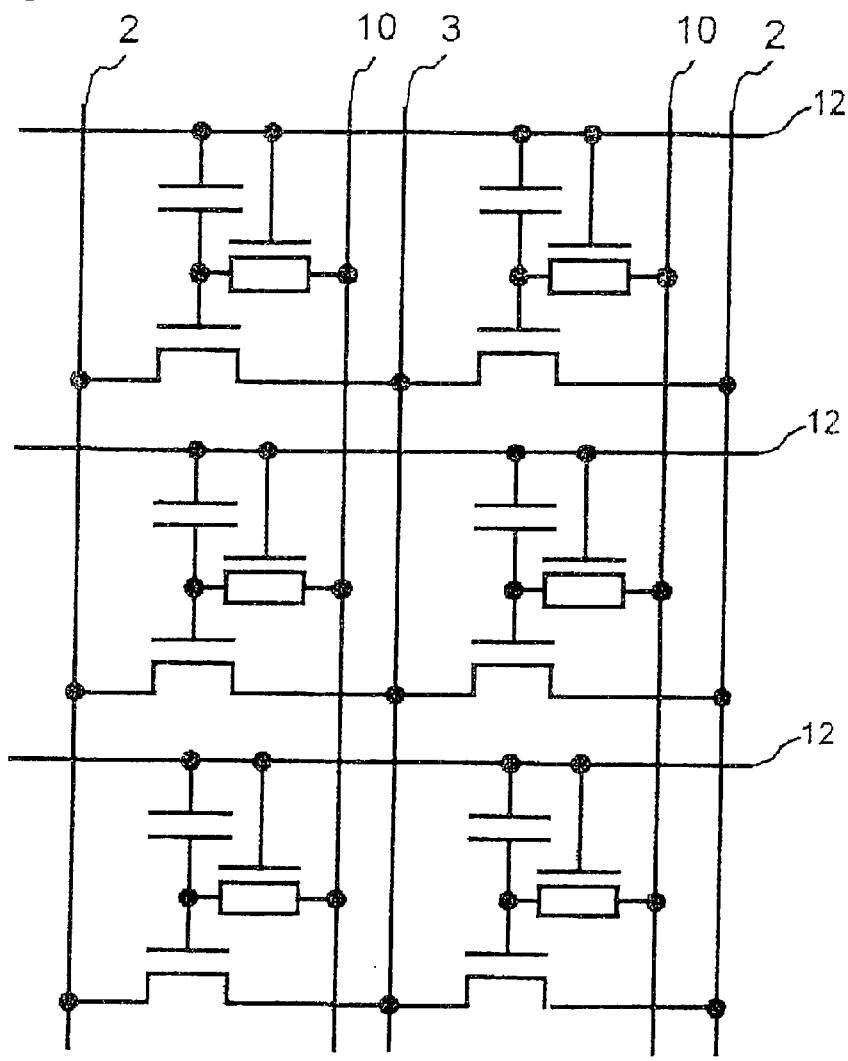
FIG. 18 shows a circuit diagram showing an equivalent circuit of the memory cell array shown in FIG. 17.

FIG. 17 shows a plan view of a memory cell array, and the equivalent circuit is shown in FIG. 18. In FIG. 17, 101 denotes an isolation insulation film for a sense MOS transistor, and 105 denotes an isolation insulation film for a stacked transistor. A manufacturing method of the present memory will be described following a cross sectional view taken along the line A-B-C-D shown in FIG. 17.

Figure 19:
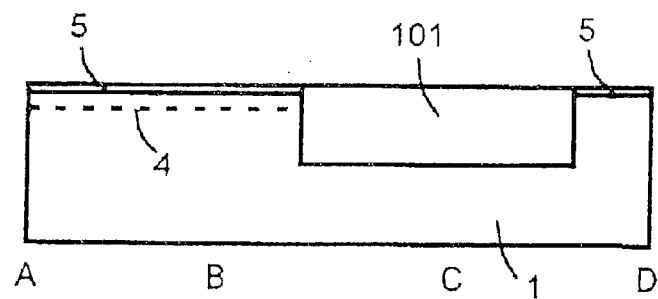
FIG. 19 shows a graph showing a forming process of the present memory cell.

FIG. 19 shows the following processes: a silicon substrate (1) of p-type and having a resistivity of about 10 W$^{-cm}$ is subjected to 350 nm dry etching using a mask of optical photoresist and after that NSG (101) is deposited 500 nm thick on the whole surface, and the surface of the substrate is planalized by a CMP (Chemical Mechanical Polishing) method. PWELL is formed by ion implantation of boron with an energy of 300 keV and a dose quantity of 1.5×$10^{13}$ cm$^{-2}$ under the NSG film (101) with another optical photomask, and further ion implantation of boron or arsenic is performed into the channel portion 4 for the adjustment of the threshold value of the MOS transistor with a further optical photomask, and after that it is annealed at 1000° C. for 30 sec. After that, the surface of the silicon substrate is exposed and a silicon oxide film (5) of 10 nm is formed by thermal oxidation in a wet ambient atmosphere at 700° C.

Figure 20:
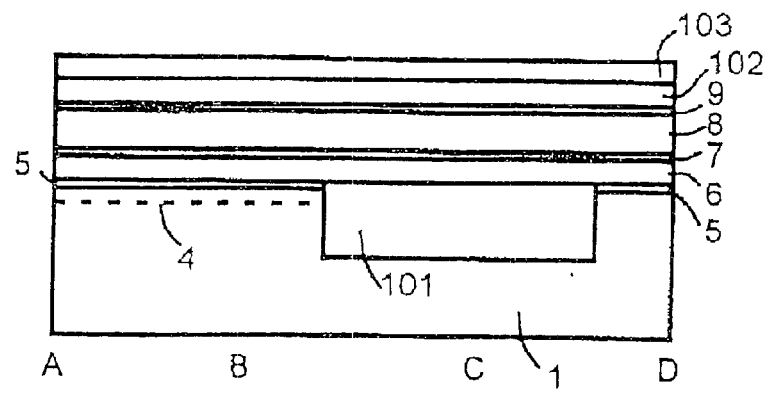
FIG. 20 shows a graph showing a forming process of the present memory cell.

FIG. 20 shows the following processes. An n-type poly silicon (phosphor dope 5×$10^{20}$ cm$^{-3}$) film of 30 nm thick (6) is deposited. After that, a laminated film is formed being composed of a non-doped poly silicon film of 20 nm thick, a silicon nitride film of 2 nm thick (7), a non-doped poly silicon film of 350 nm thick (8), a silicon nitride film of 2 nm thick (9), and a non-doped poly silicon film of 20 nm thick (102). The silicon nitride film of 2 nm thick is formed by thermal nitrification of the silicon surface in an ammonia ambient atmosphere at 800° C. to 900° C. for 1 to 3 min. In order to avoid the mixing of a natural oxide film, the laminated film shall be formed consecutively in the same chamber. The formation of non-doped poly silicon films of 20 nm thick at the beginning and at the end of the laminated film is for the protection of the tunnel films (7 and 9). The distribution of impurities in the storage node (6) is made uniform by a thermal diffusion process performed later, so that a thickness of the storage node (6) practically becomes 50 nm. After that, a silicon nitride film of 160 nm thick (103) is formed by the CVD method.

Figure 21:
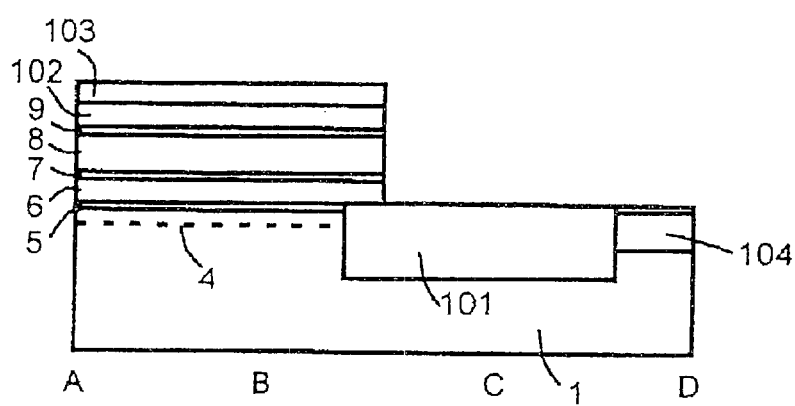
FIG. 21 shows a graph showing a forming process of the present memory cell.

FIG. 21 shows the following processes. A silicon nitride film (103), laminated films (102, 9, 8, 7), and the n-type poly silicon film (6) are removed selectively by dry etching using a mask of optical photoresist. After that, a high impurity density n-type diffusion layer (104) is formed by ion implantation of arsenic with an energy of 20 keV and a dose quantity of 2×$10^{15}$ cm$^{-2}$, and then it is annealed at 1000° C. for 30 sec.

Figure 22:
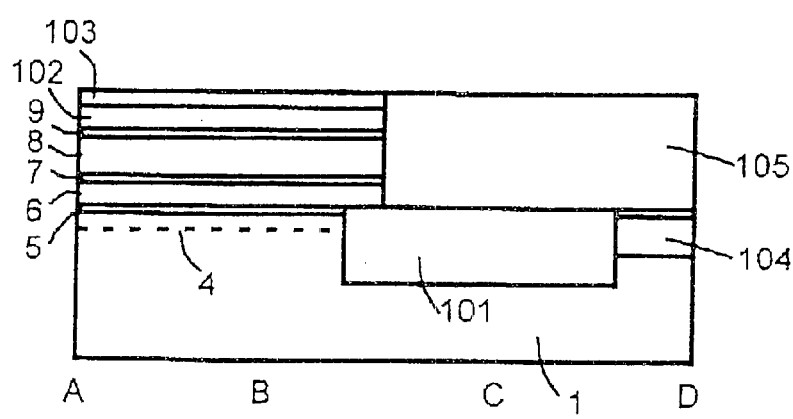
FIG. 22 shows a graph showing a forming process of the present memory cell.

FIG. 22 shows the following processes. After the deposit of NSG (105) of 650 nm thick on the whole surface of the substrate, the surface is planalized by the CMP method and the surface of the silicon nitride film (103) is exposed.

Figure 23:
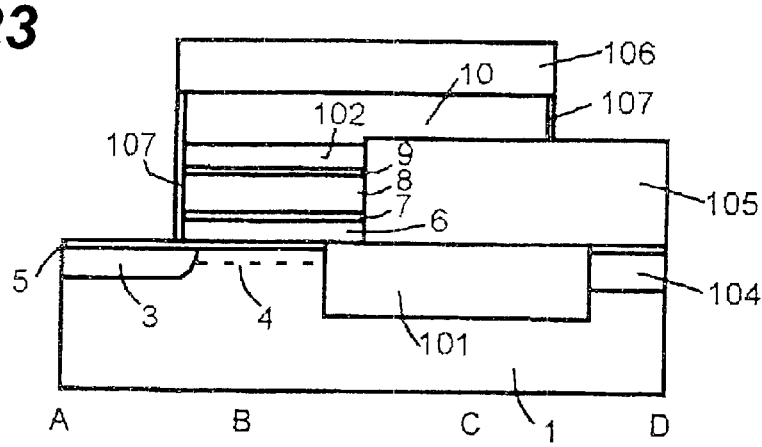
FIG. 23 shows a graph showing a forming process of the present memory cell.

FIG. 23 shows the following processes. After the silicon nitride film (103) is removed by wet etching, an n-type poly silicon film of 100 nm thick (phosphor dope 5×$10^{20}$ cm$^{-3}$) (10) and a silicon oxide film of 100 nm thick (106) are deposited, and a silicon oxide film (106), an n-type poly silicon film (10), multi-layered films (102, 9, 8, 7) using an optical photoresist as a mask and an n-type poly silicon film (6) are selectively removed by dry etching. After that, a thermal oxide film of 10 nm (107) is formed. Boron is implanted aslant by 30 degrees from 4 directions with an energy of 25 keV and a total dose quantity of 8×$10^{12}$ cm$^{-2}$, to form a channel portion of p type $10^{17}$ cm$^{-3}$. After that, arsenic is ion-implanted from the direction making a right angle with the substrate with an energy of 2 to 5 keV and a dose quantity of 1×$10^{14}$ cm$^{-2}$ to form an n type layer (3), and after that it is annealed at 950° C. for 30 sec.

Figure 24:
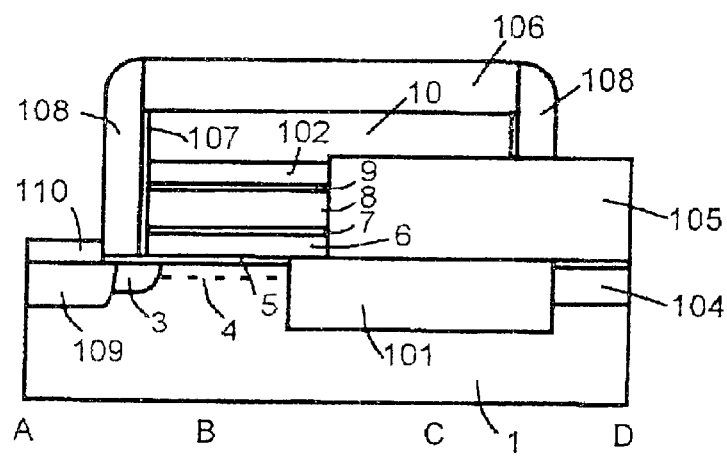
FIG. 24 shows a graph showing a forming process of the present memory cell.

FIG. 24 shows the following processes. After a silicon nitride film (108) of 30 nm thick is deposited, dry etching is performed leaving spacers (108) on only side walls. After that, arsenic is ion-implanted with an energy of 20 keV and a dose quantity of 2×$10^{15}$ cm$^{-2}$ to form an n-type diffusion layer of high impurity density (109). After that, a thermal oxide film (110) of 20 nm thick is formed.

Figure 25:
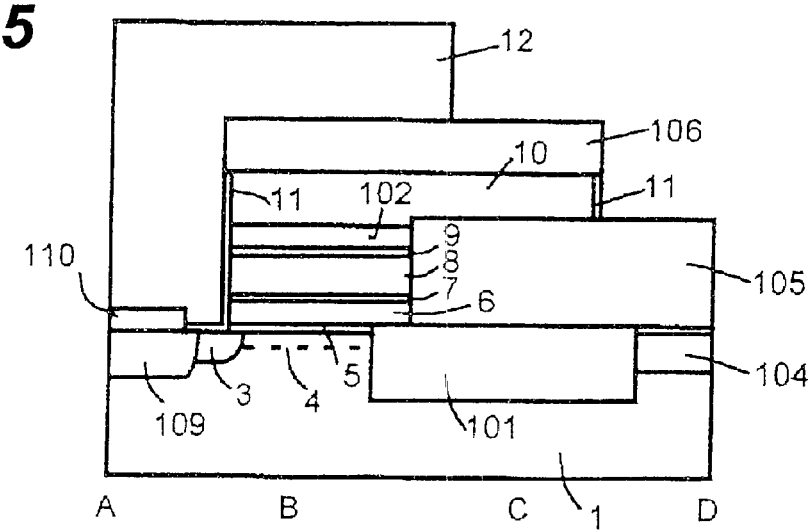
FIG. 25 shows a graph showing a forming process of the present memory cell.

FIG. 25 shows the following processes. After the silicon nitride film (108) is removed by wet etching, a p-type poly silicon film of 150 nm thick (boron dope 5×$10^{20}$ cm$^{-3}$) (12) is deposited, and the p-type poly silicon film (12) is selectively removed by dry etching with a mask of optical photoresist for patterning. The p-type poly silicon film (12) can be also formed by another process: at first, non-doped poly silicon is deposited and then boron is ion-implanted. In order to decrease the dispersion of elements, the oxide film 107 can be replaced with a new oxide film 11.

And then, passivation and wiring are performed to form a desirable element. Further it may be preferable to perform the following: in order to decrease the resistance, the n-type silicon film (10) is shunted with a metal or a salicide is used in place of the poly silicon film (12). The gate film (11) and the poly silicon film (12) can be used respectively as a gate film and a gate electrode of a MOS transistor which is used in the circuits around the memory.

Figure 26:
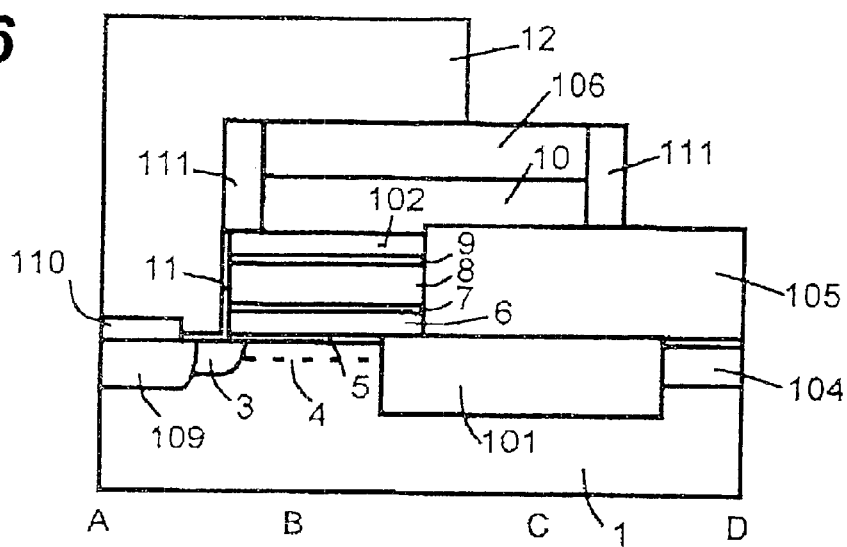
FIG. 26 shows a graph showing a cross sectional structural view of another memory cell.

As shown in FIG. 26, it may be preferable to provide a spacer layer (111) of a silicon oxide film formed by CVD method to decrease the stray capacitance between the word line (12) and the write data line (10).

In the present embodiment showed a structure in which tunnel films are provided on the borders between the channel, and the source and the drain.

Figure 27:
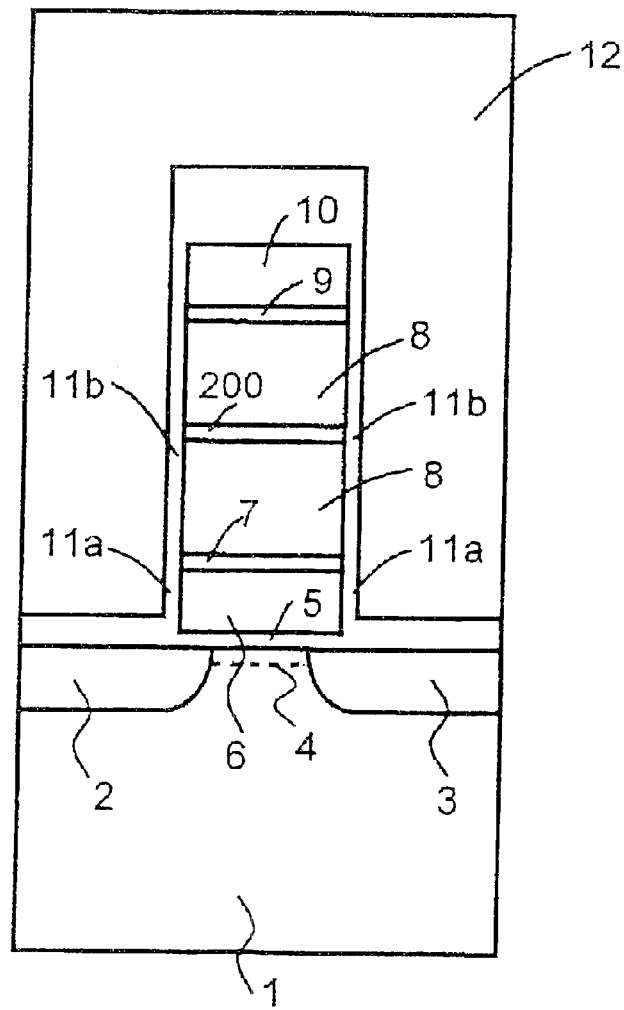
FIG. 27 shows a graph showing a cross sectional structural view of another memory cell.
Figure 28:
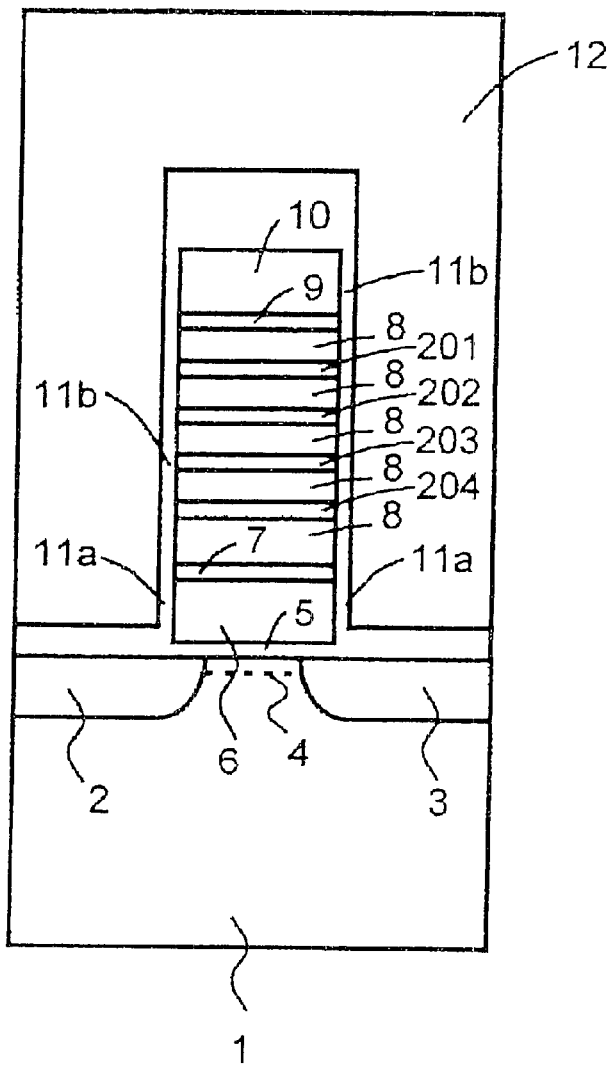
FIG. 28 shows a graph showing a cross sectional structural view of another memory cell.

It may be preferable to provide another tunnel film (200) at the center of the channel portion as shown in FIG. 27. Further it is also good to provide multi-layered tunnel films (201, 202, 203, 204) in the channel as shown in FIG. 28. When tunnel films are provided inside the channel as mentioned in the above, it is possible to reduce the OFF current largely and in the result, the storage holding time can be lengthened up to several years.

As a tunnel film following films can be used: a silicon oxide film, a silicon nitride film or a silicon oxide-nitride film, each having a thickness of 2 to 10 nm. The silicon nitride film can be a strong barrier against the diffusion of impurities, and the tunnel barrier is so low as approximately 2 eV against electrons and holes, and it is suitable for a low voltage operation. In the case of direct nitrification, since a thickness of a film is decided by a self-limiting mechanism [M. M. Moslehi and K. C. Saraswat, "Thermal Nitridation of Si and $SiO_2$ for VLSI," IEEE Trans. Electron Dev., ED-32 (February 1985) pp. 106–123], it is possible to form a thin film of 1 to 3 nm thick without a pin hole. However, it is difficult to form a silicon nitride film which is thick and stable without containing a trap by the same method. A silicon oxide film is inferior to the silicon nitride film in the point that the energy barrier height of the silicon oxide film is 3 eV and that of the silicon nitride film is 2 eV; however, the barrier height of the silicon oxide film for a hole is as high as 4.7 eV and it is effective for decreasing a leakage current caused by holes and also the degree of freedom in the film thickness is large. The silicon oxide-nitride film lies between these two. The device can be optimized by utilizing a proper one in the proper usage. For example, for the tunnel films (7 and 9) on the source and drain sides, a direct nitride film is used in order to make it have a role as a stopper for the diffusion of impurities, and for the tunnel films (200, 201, 202, 203, 204) inside the channel, silicon oxide films or silicon nitride films are used from the view point of film thickness.

Figure 29:
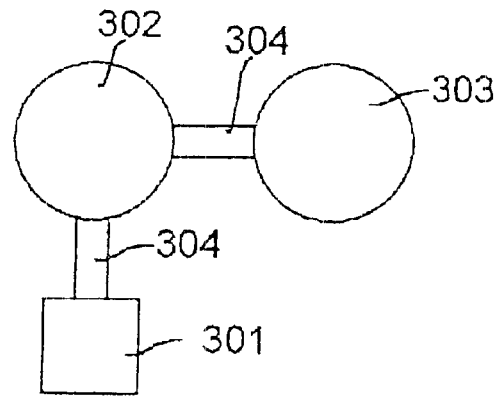
FIG. 29 shows a graph showing a forming apparatus of a multi-layered film.

For the purpose of avoiding the mixing with a natural oxide film, it is desirable to form the channel silicon film having a low impurity density (8) and the tunnel films (7, 9, 200, 201, 202, 203, 204) in a vacuum chamber by a through process without touching the open air from the point of view of the characteristics. For this purpose, it is effective that a manufacturing apparatus has a structure as shown in the following, for example as shown in FIG. 29, a carrying in/out portion for wafers of load locks (301), a silicon deposit chamber (302), and a tunnel film forming chamber (303) are connected to each other. Reference number 304 denotes a transportation path of wafers. In the case where a multi-layered tunnel film is formed, as shown in FIG. 28, it is effective to connect the above-mentioned chambers in series to increase the throughput.

Figure 30:
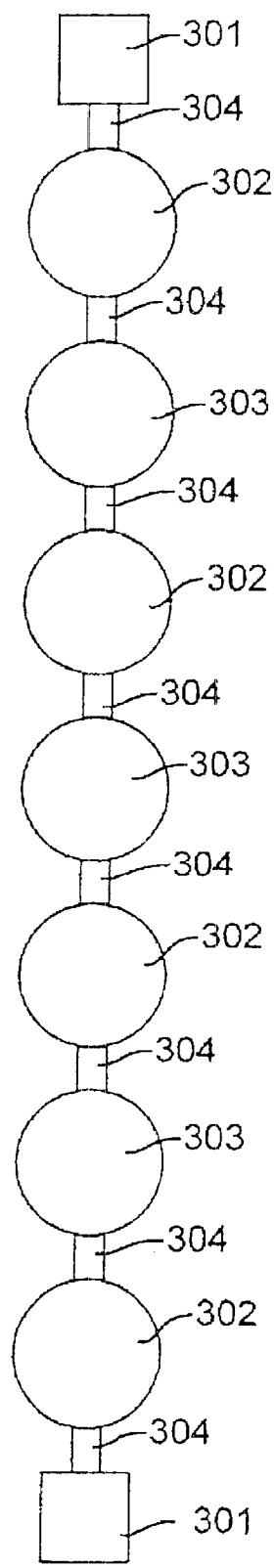
FIG. 30 shows a graph showing a forming apparatus of a multi-layered film.
Figure 31:
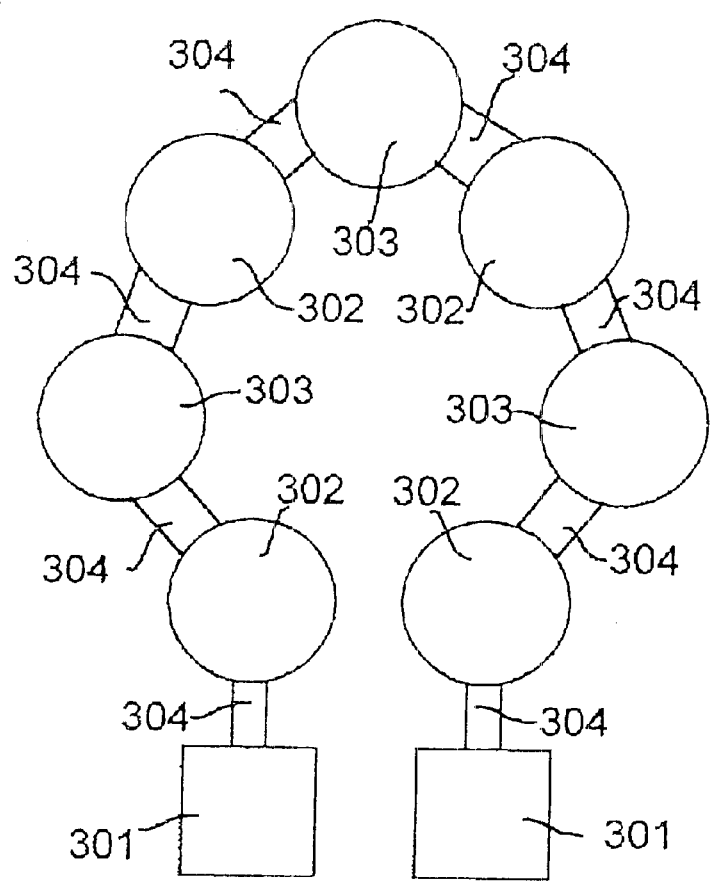
FIG. 31 shows a graph showing a forming apparatus of a multi-layered film.

FIG. 30 shows the case where these chambers are connected in a line, and FIG. 31 shows the case where they are connected in a circular shape.

In the present embodiment, an example in which the transistor according to the present invention is applied to a memory is shown; however, it is also possible to use it in a logic circuit as a transistor in which a threshold value is programmable.

It is also possible to exchange a p-type and an n-type material, and to use SOI or other semiconductors than silicon, for example SiGe, GaAs substrate, except for a silicon substrate.

As shown in the embodiment shown in the above, a memory of a high density and a large capacity can be realized, and further even a high speed and nonvolatile memory will be also realized. Furthermore, a semiconductor device in which a memory as mentioned in the above and a large scaled logic (for example, a microprocessor) are built in one chip can be realized. As well-known, the manufacture of this kind of semiconductor chip having a conventional built-in DRAM is growing more and more difficult with the miniaturization. In other words, in the case of a layered capacitor cell, in order to obtain a larger capacitance, a cell array becomes to have a structure of higher steps, which disturbs the miniaturization of a large scaled logic portion. On the other hand, in the case of a groove type capacitor cell, a deep groove having more and more large aspect ratio becomes necessary, which makes the manufacture difficult. For example, in the case of a DRAM of 256 Mbit, a groove having 40 aspect ratio or more is needed. Since the memory according to the present invention has a gain inside the cell itself, a capacitor having a specially large value is not needed. Therefore, in the case of the present memory, the structure having higher steps or the deep groove structure is not needed for miniaturization, which makes the manufacture of the memory easy; thereby, it is made possible to provide an inexpensive semiconductor device.

According to the present invention, a semiconductor device of high speed and stable in operation, and of a low cost can be realized. Further if occasion demands even a nonvolatile RAM function can be added.

In the following, main symbols will be explained in order to facilitate the understanding of the drawings.

D: a gate interval of a stacked transistor

L: a channel length of a stacked transistor tg: a thickness of the gate insulation film of a stacked transistor ts: a thickness of the tunnel film on the source side of a stacked transistor td: a thickens of the tunnel film on the drain side of a stacked transistor Nc: an impurity density in the channel portion of a stacked transistor Ns: an impurity density in the source region of a stacked transistor Nd: an impurity density in the drain portion of a stacked transistor Xd: the maximum width of a depletion layer S: a subthreshold coefficient Vth: a threshold value of a transistor

1: a semiconductor substrate (p-type silicon)

2, 3: an n-type layer of high impurity density (read data line)

4: a MOS channel

5, 11*a*, 11*b*: an insulation film

7, 9: a tunnel film

6: an n-type layer of a high impurity density (storage node)

10: an n-type layer of a high impurity density (write data line)

8: a semiconductor layer of a low impurity density

12: a p-type layer of a high impurity density (word line)

101: an isolation insulation film of a sense MOS transistor

102: a non-doped silicon film

103: a CVD silicon nitride film

104, 109: an n-type layer of a high impurity density for wiring

105: an isolation insulation film of a stacked transistor

106: a CVD silicon oxide film

107, 110, 111: a silicon oxide film

108: a spacer layer of a CVD silicon nitride film 200, 201, 202, 203, 204: a tunnel film

301: a carrying in/out portion for wafers of load locks

302: a silicon deposit chamber

303: a tunnel film forming chamber

304: a transportation path of wafers

What is claimed is:

1. A semiconductor device comprising a memory cell including a MOS transistor having a gate which holds an information voltage corresponding to information, a write transistor for providing said information voltage and a capacitor for controlling the gate voltage, wherein said write transistor and said capacitor are provided such that they are overlying said MOS transistor and wherein a current path direction of said write transistor is different from a current path direction of said MOS transistor.

2. A semiconductor device as claimed in claim 1, wherein a first and a second terminals of said write transistor are respectively connected to said gate and a data line for giving write data, a third terminal thereof is connected to a word line, an electrode at an end of said capacitor is connected to said gate, and the voltage of an electrode at another end of said capacitor is controlled at the time of reading said memory cell.

3. A semiconductor device as claimed in claim 2, wherein the electrode at another end of said capacitor is connected to said word line.

4. A semiconductor device as claimed in claim 1, wherein a current path of said MOS transistor and that of the write transistor make an right angle with each other.

5. A semiconductor device as claimed in claim 1, wherein said capacitor is formed by a film which is contiguous to a gate insulation film of said write transistor.

6. A semiconductor device as claimed in claim 1, wherein the maximum width of a depletion layer in a channel portion of said write transistor is larger than the gate interval of said write transistor.

7. A semiconductor device as claimed in claim 1, wherein the channel length (L) of said write transistor satisfies the following condition, $$L > 5\sqrt{D^{2/8 + \epsilon_{si}/2\epsilon_g D_g}}$$

where D is a gate interval, $t_g$ is a thickness of a gate insulation film, $\epsilon_{si}$ is a relative permittivity of silicon, and $\epsilon_g$ is a relative permittivity of the gate insulation film.

8. A semiconductor device as claimed in claim 1, wherein said memory cells are disposed in a matrix form.

9. A semiconductor device as claimed in claim 1, wherein the threshold value and the coupling capacity are so set that the write transistor is in an OFF state when not selected, and is in an ON state or in an OFF state according to a high state or a low state of the storage information at the time of reading.

10. A semiconductor device as claimed in claim 1, wherein a tunnel film is disposed in the channel portion of said write transistor.

11. A semiconductor device as claimed in claim 10, wherein said tunnel film is disposed on borders between the channel and, a source and a drain of said write transistor.

12. A semiconductor device as claimed in claim 10, wherein said tunnel film is disposed around a center of the channel portion.

13. A semiconductor device as claimed in claim 10, wherein two layers or more of said tunnel films are disposed inside the channel portion.

14. A manufacturing apparatus for forming a semiconductor device as claimed in claim 1, wherein the apparatus forms a semiconductor film and a tunnel film stably and consecutively under an isolated condition from the open air.

15. A semiconductor device which is formed on a substrate, wherein the quantity of charge passing through the device can be controlled by controlling an electric field provided thereto, comprising:

a first node and a second node serving as a path of said charge;

a channel region disposed between said first node and said second node and serving as the path of said charge;

gate electrodes disposed for the purpose of providing said electric field to said channel region;

a first tunnel barrier disposed between said first node and said channel region; and a second tunnel barrier disposed between said second node and said channel region;

wherein said first node, the channel region, and said second node are formed with silicon as a main ingredient, and the impurity density of the first and the second nodes is higher than that of the channel region, at least part of said tunnel barrier is formed with a nitride film or an oxide film, and said first node, said channel region, and said second node are stacked as a multi-layered structure in a direction perpendicular to a main surface of said substrate.

16. A semiconductor device as claimed in claim 15, wherein the impurity density in said first node and said second node is $10^{20}$ cm$^{-3}$ or more.

17. A semiconductor device as claimed in claim 15, wherein the impurity density in said channel region is $10^{17}$ cm$^{-3}$ or less.

18. A semiconductor device as claimed in claim 15, wherein at least part of said tunnel barrier is formed by direct nitridation of a silicon surface.

19. A semiconductor device as claimed in claim 15, wherein:

said first node, said channel region, and said second node are formed in a multi-layered structure and are built in a pillar structure in the direction perpendicular to the main surface of said substrate, wherein said gate electrodes are formed along the side surface of said pillar structure and include first and second gate electrode regions and wherein the pillar structure is present between the first gate electrode region and the second gate electrode region when viewed in a cross sectional view taken along a plane perpendicular to the main surface of said substrate, and in said channel region the maximum value DL of the interval between said first gate electrode region and said second gate electrode region is smaller than the maximum width $X_d$ of the depletion layer, on the condition that $$X_d = 5\sqrt{(2kT \epsilon E/(e \cdot N_c)}$$

where k is Boltzman constant, T is an absolute temperature in the work environment of the semiconductor device $\epsilon$ is a dielectric constant of silicon, e is an absolute value of an electron charge, and $N_c$ is an impurity density in the channel region.

20. A semiconductor device as claimed in claim 19, wherein the relation between said channel region length L and said maximum value DL of the gate interval keeps the condition L>DL.

21. A semiconductor device as claimed in claim 15, wherein said channel region is formed with p-type silicon.

22. A semiconductor device as claimed in claim 21, wherein said gate electrode is formed with p-type silicon having a density higher than that in said channel region.

23. A semiconductor device as claimed in claim 15, wherein the impurity densities in said first node, said channel region, and said second node are varied discontinuously making said first tunnel barrier and said second tunnel barrier borders.

24. A semiconductor device as claimed in claim 15, further comprising a third tunnel barrier between said first and said second tunnel barriers.

25. A transistor comprising:

a source region and a drain region;

a channel region disposed between said source region and said drain region;

gate electrodes disposed adjacent to said channel region for the purpose of providing an electric field to said channel region;

a first nitride film disposed between said source region and said channel region; and a second nitride film disposed between said drain region and said channel region;

wherein said source region, said channel region, and said drain region are comprised of semiconductor materials and the density of impurities in the source region and the drain region is higher than that in the channel region, and the density of impurities in said source region, said channel region, and said drain region have an impurity density profile which are discontinuous at a portion of the borders of said first nitride film and said second nitride film.

26. A transistor as claimed in claim 25, wherein said first nitride film and said second nitride film function as tunnel barriers.

27. A transistor comprising:

a first electrode, a channel region, and a second electrode stacked in a form of multi-layered structure upon a main surface of a substrate;

gate electrodes disposed adjacent to a side surface of said channel region through an insulation film;

a first intermediate film serving as a first tunnel barrier disposed between said first electrode and said channel region in a same direction as the main surface; and a second intermediate film serving as a second tunnel barrier disposed between said second electrode and said channel region in a same direction as the main surface;

wherein the relation between L and W is kept under the condition of L>W, where L is a length of said channel region and W is a maximum value of a width of said channel region.

28. A transistor as claimed in claim 27, wherein:

the length L of said channel region is equal to the interval between said first intermediate film and said second intermediate film, and seen from a cross sectional view taken along a plane perpendicular to the piled up direction of said first electrode, said channel region and said second electrode, said gate electrodes are disposed in both sides of said channel region, and the maximum value W of the width of said channel region denotes the maximum value of the interval of gate electrodes disposed being separated from each other.

* * * * *